US011404363B2

(12) United States Patent
Hotta et al.

(10) Patent No.: US 11,404,363 B2
(45) Date of Patent: Aug. 2, 2022

(54) CONNECTION TERMINAL UNIT

(71) Applicant: AISIN CORPORATION, Kariya (JP)

(72) Inventors: Yutaka Hotta, Chiryu (JP); Shinya Osuka, Nishiro (JP); Yasuhiro Kume, TakaHama (JP)

(73) Assignee: AISIN CORPORATION, Kariya (JP)

( * ) Notice: Subject to any disclaimer, the term of this patent is extended or adjusted under 35 U.S.C. 154(b) by 33 days.

(21) Appl. No.: 16/959,548

(22) PCT Filed: Jan. 16, 2019

(86) PCT No.: PCT/JP2019/001095
§ 371 (c)(1),
(2) Date: Jul. 1, 2020

(87) PCT Pub. No.: WO2019/150950
PCT Pub. Date: Aug. 8, 2019

(65) Prior Publication Data
US 2021/0074617 A1 Mar. 11, 2021

(30) Foreign Application Priority Data

Jan. 31, 2018 (JP) .............................. JP2018-015928
Aug. 27, 2018 (JP) .............................. JP2018-158291

(51) Int. Cl.
*H01L 23/498* (2006.01)
*H01L 23/31* (2006.01)
(Continued)

(52) U.S. Cl.
CPC .... *H01L 23/49811* (2013.01); *H01L 23/3107* (2013.01); *H01L 23/49838* (2013.01);
(Continued)

(58) Field of Classification Search
CPC ............................................... H01L 23/49811
See application file for complete search history.

(56) References Cited

U.S. PATENT DOCUMENTS

2016/0035646 A1* 2/2016 Soyano .................. H01L 25/18
257/692
2017/0330810 A1 11/2017 Joko et al.

FOREIGN PATENT DOCUMENTS

JP    S50-125072 U    10/1975
JP    H03-85655 U    8/1991
(Continued)

OTHER PUBLICATIONS

Apr. 2, 2019 International Search Report issued in International Patent Application No. PCT/JP2019/001095.

*Primary Examiner* — William A Harriston
(74) *Attorney, Agent, or Firm* — Oliff PLC

(57) ABSTRACT

A connection terminal unit that can be appropriately connected to terminal connection portions of a semiconductor module including a semiconductor element and that can reduce a projection area when seen in a direction orthogonal to a direction along a chip surface is realized. Connection terminal unit includes plurality of connection terminals facing and connected to plurality of terminal connection portions of semiconductor module, and terminal mold portion holding connection terminals. Terminal mold portion has abutment portion that abuts against semiconductor module or base material holding semiconductor module. Abutment portion has vertical abutment portion that abuts against semiconductor module or base material from vertical direction that is a direction in which connection terminals face terminal connection portions, and side abutment portion that abuts against semiconductor module or base material from at least two directions that are different from each other and intersect with vertical direction.

20 Claims, 10 Drawing Sheets

(51) Int. Cl.
*H05K 3/30* (2006.01)
*H05K 3/34* (2006.01)
*H01L 23/00* (2006.01)
*H02M 7/00* (2006.01)

(52) U.S. Cl.
CPC ............ *H01L 24/37* (2013.01); *H02M 7/003* (2013.01); *H05K 3/301* (2013.01); *H05K 3/308* (2013.01); *H05K 3/3447* (2013.01); *H05K 2201/10166* (2013.01)

(56) References Cited

FOREIGN PATENT DOCUMENTS

| | | |
|---|---|---|
| JP | H05-259334 A | 10/1993 |
| JP | 2010-160916 A | 7/2010 |
| JP | 2010-176922 A | 8/2010 |
| JP | 2011-253942 A | 12/2011 |
| JP | 2017-50326 A | 3/2017 |
| JP | 2017-208382 A | 11/2017 |
| WO | 2015/045648 A1 | 4/2015 |

\* cited by examiner

CONNECTION TERMINAL UNIT

TECHNICAL FIELD

The preferred embodiment relates to a connection terminal unit including a plurality of connection terminals connected to a plurality of terminal connection portions provided on a semiconductor module.

BACKGROUND ART

For example, a plurality of terminal connection portions of a semiconductor module including a power semiconductor element such as insulated gate bipolar transistors (IGBTs) or power metal oxide semiconductor field effect transistors (MOSFETs) are connected to a control circuit etc. via a connection terminal unit having a plurality of connection terminals. Japanese Unexamined Patent Application Publication No. 2011-253942 (JP 2011-253942 A) discloses, as an example of such a connection terminal unit, a plurality of signal terminals (5) and a terminal base (4) in which these signal terminals (5) are integrally resin-molded (FIG. 1, [0014] to [0016] etc.). In the description of the background art, the reference signs in parentheses are those of the referenced document. One end side of each of the signal terminals (5) is electrically connected to an electrode of the semiconductor element (3) or a bus bar (8) connected to the semiconductor element (3) by a bonding wire (6). The other end side of the signal terminal (5) is electrically connected to an external electric machine or the like. That is, the semiconductor element (3) is electrically connected to an external electric machine or the like via the terminal base (4) having the signal terminal (5).

When the signal terminal (5) and the semiconductor element (3) are connected using the bonding wire (6), the tolerance of the relative position between the signal terminal (5) and the semiconductor element (3) can be increased. Thus, the signal terminal (5) and the semiconductor element (3) can be appropriately connected. However, since a space for wiring the bonding wire (6) is required, the occupation area (projected area) of the terminal block (4), the connection terminal (5), and the semiconductor element (3) when viewed in a direction orthogonal to a direction along a chip surface of the semiconductor (3) tends to be large. Since this hinders the downsizing of the semiconductor module including the semiconductor element (3), improvement is required.

RELATED ART DOCUMENTS

Patent Documents

Patent Document 1: Japanese Unexamined Patent Application Publication No. 2011-253942 (JP 2011-253942 A)

SUMMARY OF THE INVENTION

Problem to be Solved by the Invention

In view of the above background, it is desired to realize a connection terminal unit that can be appropriately connected to a terminal connection portion of a semiconductor module including a semiconductor element and that can reduce a projection area when viewed in a direction orthogonal to a direction along a chip surface.

Means for Solving the Problem

In view of the above, the connection terminal unit includes: a plurality of connection terminals that face a plurality of terminal connection portions provided in a semiconductor module including at least one switching element and that are connected to the respective terminal connection portions; and a terminal mold portion holding the connection terminals. The terminal mold portion has an abutment portion that abuts against the semiconductor module or a base material holding the semiconductor module. The abutment portion has a vertical abutment portion that abuts against the semiconductor module or the base material from a vertical direction that is a direction in which the connection terminals face the terminal connection portions, and a side abutment portion that abuts against the semiconductor module or the base material from at least two directions that are different from each other and intersect with the vertical direction.

With the configuration, since the connection terminals face the respective terminal connection portion so that the connection terminals and the terminal connection portions are connected, no space is required for wiring bonding wires and the like. Here, it is preferable that the relative positions of the connection terminal unit and the semiconductor module be accurately aligned so that each connection terminal and each terminal connection portion face each other appropriately. According to the present configuration, the relative positions in the vertical direction are defined by the vertical abutment portion, and the relative positions in two directions intersecting with the vertical direction are defined by the side abutment portion. That is, since the relative positions of the connection terminal unit and the semiconductor module are defined from three directions, the positions of each connection terminal and each terminal connection portion can be accurately aligned so as to face each other appropriately. In other words, with the connection terminal unit according to the present configuration, the connection terminal unit can be appropriately connected to the terminal connection portions of the semiconductor module including the semiconductor element, and the projected area when seen in a direction orthogonal to the direction along the chip surface can be further decreased.

Further features and advantages of the connection terminal unit will become clear from the following description of an embodiment described with reference to the drawings.

MODES FOR CARRYING OUT THE INVENTION

Figure 1:
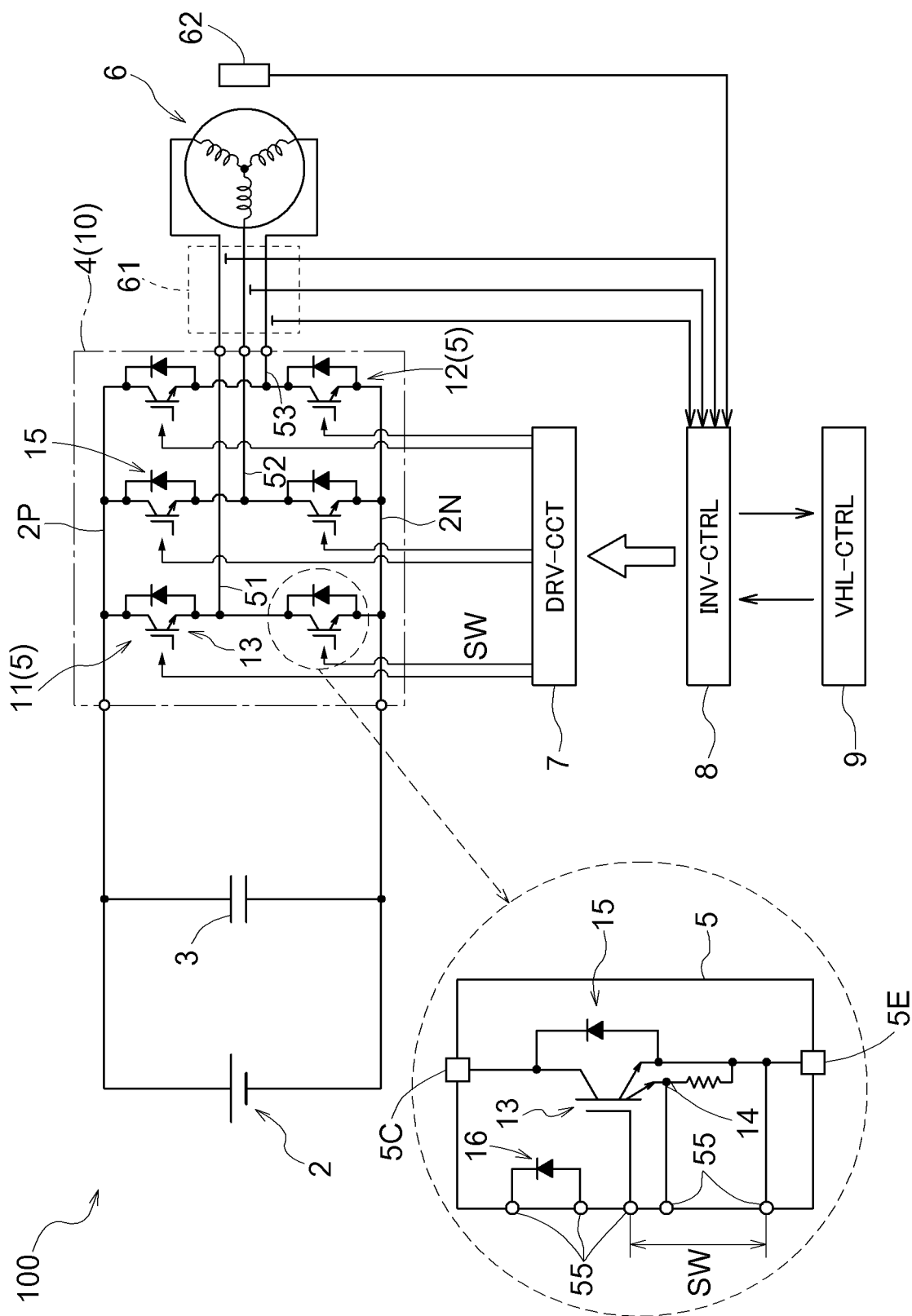
FIG. 1 is a schematic circuit block diagram of a rotating electrical machine driving device.

Hereinafter, an embodiment of a connection terminal unit will be described based on the drawings, and an example is given of a form in which the connection terminal unit is connected to a semiconductor module, which configures an inverter that drives and controls a rotating electrical machine. FIG. 1 illustrates a schematic circuit block of a rotating electrical machine driving device 100 including an inverter 4. The rotating electrical machine driving device 100 controls a rotating electrical machine 6 serving as a driving force source of a vehicle (wheels) in an electric vehicle or a hybrid vehicle, for example. The rotating electrical machine 6 is an alternating current rotating electrical machine driven by multi-phase alternating current (for example, three phases composed of a U phase, a V phase, and a W phase). The inverter 4 is connected to a direct current power source 2 and the rotating electrical machine 6, and converts electric power between the direct current and the multi-phase alternating current. A direct current link capacitor 3 (smoothing capacitor) for smoothing a direct current side voltage (direct current link voltage) of the inverter 4 is provided between the direct current power source 2 and the inverter 4.

The inverter 4 includes a plurality of switching elements 13. The switching elements 13 are preferably power semiconductor elements capable of operating at a high frequency. For example, insulated gate bipolar transistors (IGBTs), power metal oxide semiconductor field effect transistors (MOSFETs), silicon carbide-metal oxide semiconductor FETs (SiC-MOSFETs), SiC-static induction transistors (SiC-SITS), gallium nitride-MOSFETs (GaN-MOSFETs), or the like can be used as the switching elements 13. As illustrated in FIG. 1, in the present embodiment, the IGBTs are illustrated as examples of the switching elements 13. Further, a freewheel diode 15 is connected to each switching element 13, in parallel.

In the present embodiment, the switching element 13 and the freewheel diode 15 are integrated on one semiconductor chip, and are configured as one semiconductor module 5 together with other circuit elements and terminal connection portions 55 described later. In the present embodiment, the semiconductor chip is formed in a rectangular shape that is a shape close to a square (for example, an aspect ratio of about 0.8 to 1.2) (see FIG. 2). As illustrated in FIG. 1, in the present embodiment, the semiconductor module 5 is formed by integrating a current detection circuit 14 and a temperature detection diode 16 in addition to the freewheel diode 15. The temperature detection diode 16 functions as a temperature detection sensor that detects the temperature of the switching element 13. The current detection circuit 14 applies a minute current (sense current) proportional to an element current (drain-source current) flowing between the input and output terminals (drain-source) to detects an element current.

In the present embodiment, the semiconductor module 5 has seven terminals. Among the seven terminals, two terminals (a collector terminal 5C and an emitter terminal 5E) indicated by squares in FIG. 1 are terminals through which a large current flows and which are connected to a bus bar (such as 2N, 2P, 51, 52, and 53) described below. The collector terminal 5C is formed on one surface of the plate-shaped semiconductor chip and the emitter terminal 5E is formed on the other surface (see FIG. 2, FIG. 7, etc.). The remaining five terminals indicated by circles in FIG. 1 are terminals through which currents smaller than that of the collector terminal 5C and the emitter terminal 5E are applied, and which are connected to an inverter control device (INV-CTRL) 8 via a drive circuit (DRV-CCT) 7. These five terminals are linearly disposed side by side as terminal connection portions 55 (see FIG. 2 etc.) connected to a connection terminal unit 1 (see FIG. 2).

As described above, each switching element 13 is configured as the semiconductor module 5. As illustrated in FIG. 1, the semiconductor modules 5 corresponding to the switching elements 13 include upper stage side semiconductor modules 11 that are connected to a positive electrode of the direct current power source 2 and lower stage side semiconductor modules 12 that are connected to a negative electrode of the direct current power source 2. In each phase (U phase, V phase, and W phase), the upper stage side semiconductor module 11 and the lower stage side semiconductor module 12 are connected in series to form one arm, and an intermediate point of each arm is connected to a stator coil of a corresponding one of the phases of the rotating electrical machine 6. In the following description, the U phase upper stage side semiconductor module 11 is represented by a reference sign "11$u$", the V phase upper stage side semiconductor module 11 is represented by a reference sign "11$v$", and the W phase upper stage side semiconductor module 11 is represented by a reference sign "11$w$". Similarly, the U phase lower stage side semiconductor module 12 is represented by a reference sign "12$u$", the V phase lower stage side semiconductor module 12 is represented by a reference sign "12$v$", and the W phase lower stage side semiconductor module 12 is represented by a reference sign "12$w$".

The inverter control device 8 performs current feedback control using a vector control method, based on a target torque of the rotating electrical machine 6 provided from a higher-level vehicle control device (VHL-CTRL) 9, for example. The actual current flowing through the stator coil of each phase of the rotating electrical machine 6 is detected by an alternating current sensor 61. The magnetic pole position of the rotor of the rotating electrical machine 6 at each time point is detected by a rotation sensor 62 such as a resolver. The inverter control device 8 performs the current feedback control using the detection results of the alternating current sensor 61 and the rotation sensor 62, and generates a control signal for individually controlling the switching of switching elements 13. The generated control signal is provided to each switching element 13 as a switching control signal SW via the drive circuit 7 that amplifies a voltage or a current to increase the driving capability.

Figure 2:
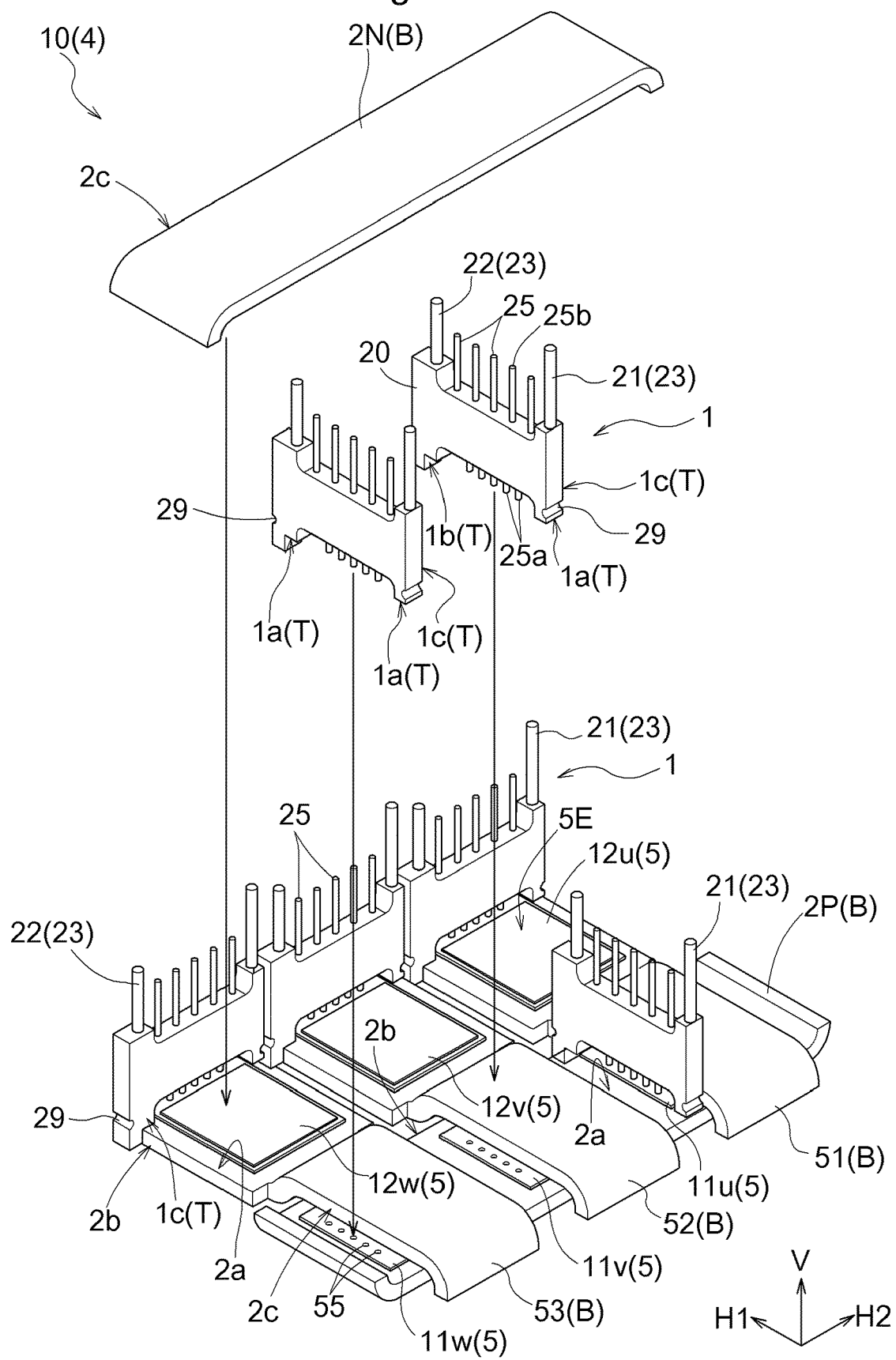
FIG. 2 is an exploded perspective view of an inverter unit including a connection terminal unit.
Figure 3:
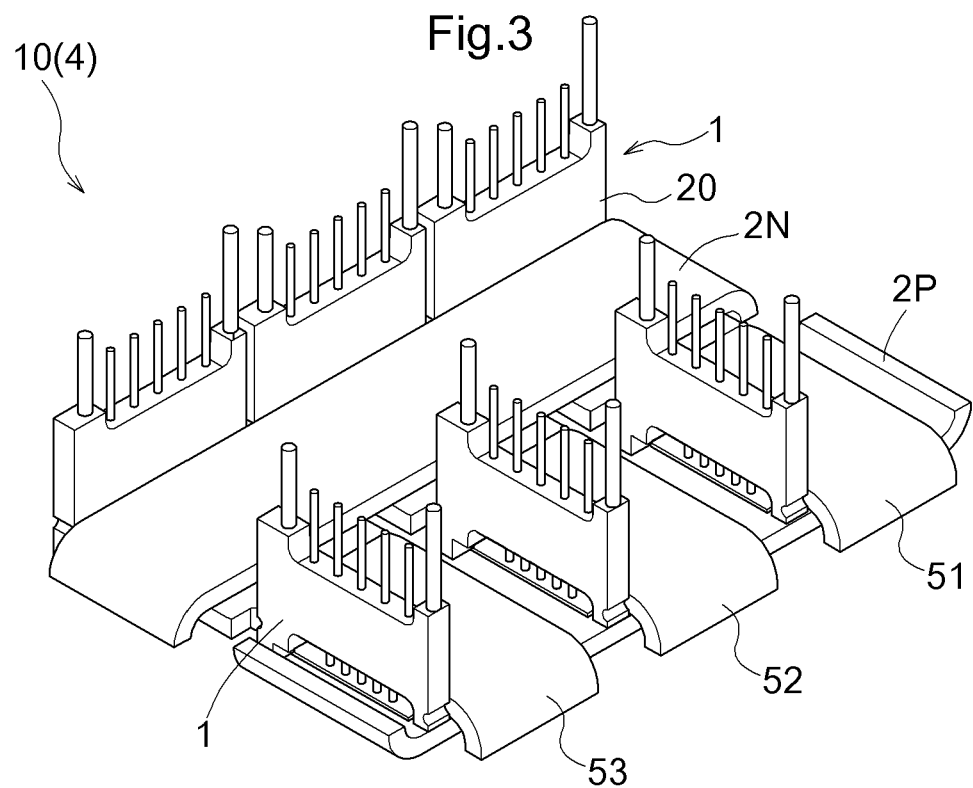
FIG. 3 is a perspective view of the inverter unit before molding.
Figure 4:
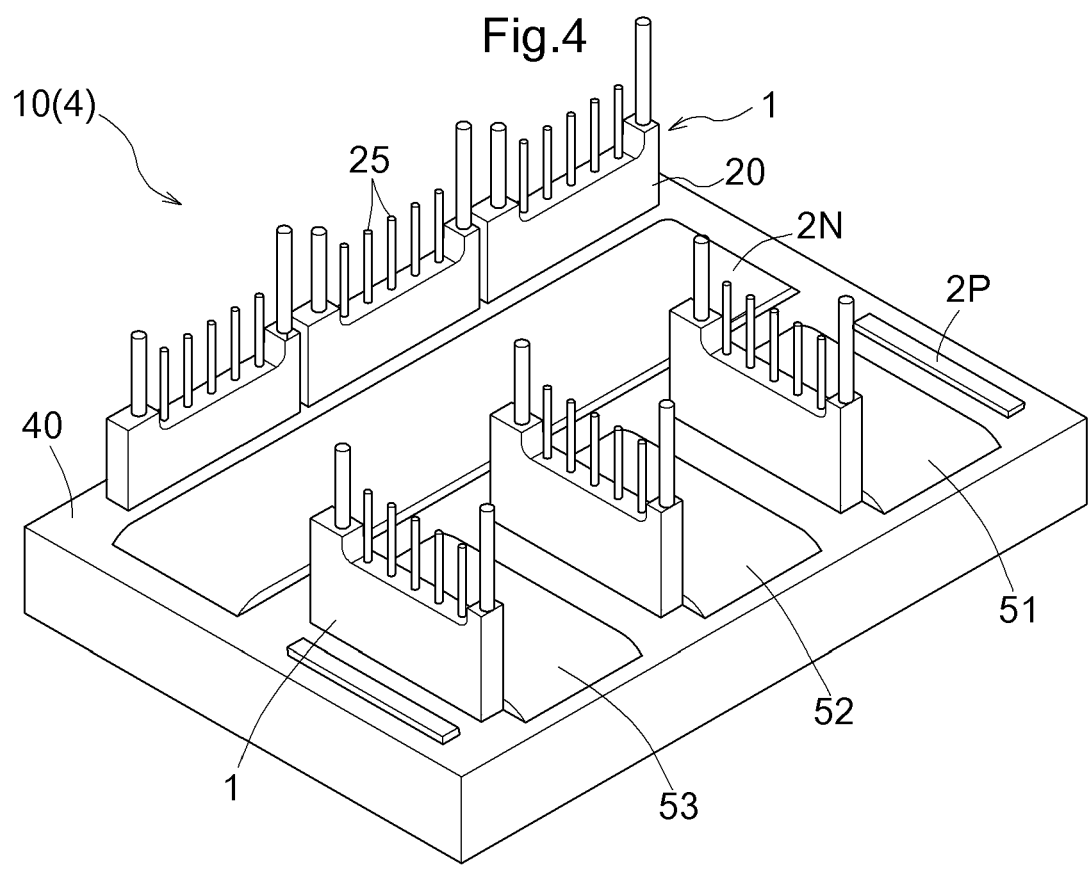
FIG. 4 is a perspective view of the inverter unit after molding.

As illustrated in FIG. 2 to FIG. 4, in the inverter 4, the semiconductor modules 5, bus bars (51, 52, 53) that connect the upper and lower stage semiconductor modules 5 of respective phases and that are connected to the stator coils of the rotating electrical machine 6, and bus bars (2P, 2N) connecting the semiconductor modules 5 and the direct current power source 2 are configured as an integrated inverter unit 10 by resin molding. FIG. 2 is an exploded perspective view of the inverter unit 10. FIG. 3 is a perspective view of the inverter unit 10 before resin molding. FIG. 4 is a perspective view of the inverter unit 10 after resin molding.

The inverter unit 10 includes the positive electrode bus bar 2P, the negative electrode bus bar 2N, and a plurality of the output bus bars (51, 52, 53) in addition to the semiconductor modules 5. When the rotating electrical machine 6 is driven by a three-phase alternating current as in the present embodiment, the first output bus bar 51, the second output bus bar 52, and the third output bus bar 53 are provided as a plurality of output bus bars. In the present embodiment, the first output bus bar 51 corresponds to the U phase, the second output bus bar 52 corresponds to the V phase, and the third output bus bar 53 corresponds to the W phase.

As illustrated in FIG. 4, the semiconductor modules 5, the positive electrode bus bar 2P, the negative electrode bus bar 2N, and the output bus bars (51, 52, 53) are integrated such that they are each at least partially embedded in an element mold portion 40 made of a mold resin, for example. The connection terminals 25 connected to the respective terminal connection portions 55 of each semiconductor module 5, the positive electrode bus bar 2P, the negative electrode bus bar 2N, and the output bus bar (51, 52, 53) are each partially exposed outside of the element mold portion 40, to be connected to another circuit device (the direct current power source 2, the inverter control device 8, the drive circuit 7, and the rotating electrical machine 6).

As illustrated in FIG. 2, the upper stage side semiconductor module 11 and the lower stage side semiconductor module 12 of each phase are disposed side by side in a first lateral direction H1 for each of the U, V, and W phases. For example, the U phase upper stage side semiconductor module 11u and the U phase lower stage side semiconductor module 12u are disposed side by side in the first lateral direction H1 (the same applies to the V phase and W phase). The three upper stage side semiconductor modules 11 are disposed side by side in a second lateral direction H2 intersecting with the first lateral direction H1, and the three lower stage side semiconductor modules 12 are disposed side by side in the second lateral direction H2. The three upper stage side semiconductor modules 11 are disposed on the same plane as each other and the three lower stage side semiconductor modules 12 are also disposed on the same plane as each other.

That is, the three upper stage side semiconductor modules 11 corresponding to the respective three phases are disposed side by side in the second lateral direction H2 on the same plane as each other, and the three lower stage side semiconductor modules 12 corresponding to the respective three phases are disposed in parallel to the arrangement direction and are disposed side by side in the second lateral direction H2 on the same plane as each other. Further, in the present embodiment, the upper stage side semiconductor module 11 and the lower stage side semiconductor module 12 of each phase are both disposed on the same plane as each other.

As described above, all (six in the present example) semiconductor modules 5 that configure the inverter 4 are disposed in a matrix of 2 lines by 3 lines on the same plane. In the present embodiment, the intersection angle between the first lateral direction H1 and the second lateral direction H2 is 90°, and the first lateral direction H1 and the second lateral direction H2 are orthogonal to each other. Incidentally, in the present embodiment, a direction orthogonal to both the first lateral direction H1 and the second lateral direction H2 is referred to as a "vertical direction V". In the following description, in the vertical direction V, a side closer to a control circuit board 80 relative to the inverter unit 10 may be referred to as "upper", and the opposite side thereof may be referred to as "lower". This does not necessarily match the "upper (vertical upper side)" or the "lower (vertical lower side)" when the inverter unit 10 is installed.

In contrast to the six semiconductor modules 5 that are aligned and disposed in two lines by 3 lines on the same plane, the positive electrode bus bar 2P, the negative electrode bus bar 2N, and the output bus bars (51, 52, 53) are each disposed in the following manner. As illustrated in FIG. 2 etc., the positive electrode bus bar 2P is in contact with and is electrically connected to the lower surfaces (collector terminals 5C) of the upper stage side semiconductor modules 11 (11u, 11v, 11w) of all phases, and is disposed along the second lateral direction H2 in this state. The positive electrode bus bar 2P functions as a base material B that supports the upper stage side semiconductor modules 11 (semiconductor modules 5).

The output bus bars (51, 52, 53) are in contact with and are electrically connected to the upper surfaces (emitter terminals 5E) of the upper stage side semiconductor modules 11 of the respective phases, and are disposed along the first lateral direction H1 in this state. Output bus bars (51, 52, 53) are disposed parallel to each other along the first lateral direction H1. In the present embodiment, each output bus bar (51, 52, 53) is disposed so as to be orthogonal to the positive electrode bus bar 2P in which the upper stage side semiconductor module 11 is arranged. As illustrated in FIG. 2, each output bus bar (51, 52, 53) is formed with a step in the first lateral direction H1. The lower surface side of each output bus bar (51, 52, 53) is in contact with the upper surface (emitter terminal 5E) of the upper stage side semiconductor module 11, and then the output bus bar (51, 52, 53) bends and extends to the lower surface side. The upper surface of each output bus bar (51, 52, 53) after being bent and extended and the upper surface of the positive electrode bus bar 2P (the surface in contact with the lower surfaces (collector terminals 5C) of the upper stage side semiconductor modules 11) are positioned on the same plane.

The lower stage side semiconductor module 12 (12u, 12v, 12w) associated with a corresponding one of the three phases is disposed on the upper surface of a corresponding one of the output bus bars (51, 52, 53) after being bent and extended. Each output bus bar (51, 52, 53) is in contact with and is electrically connected to the lower surface (collector terminal 5C) of the corresponding lower stage side semiconductor module 12. That is, the emitter terminal 5E of the upper stage side semiconductor module 11 and the collector terminal 5C of the lower stage side semiconductor module 12 are electrically connected via the output bus bar (51, 52, 53). Each output bus bar (51, 52, 53) functions as the base material B that supports the lower stage side semiconductor module 12 (semiconductor module 5). In addition, when the upper and lower sides are inverted in the vertical direction V, the upper stage side semiconductor module 11 is disposed on each output bus bar (51, 52, 53). Thus, each output bus bar (51, 52, 53) can function as the base material B that supports the upper stage side semiconductor module 11 (semiconductor module 5).

The upper surface of each output bus bar (51, 52, 53) at a position at which the lower stage side semiconductor module 12 is disposed is positioned on the same plane as the upper surface of the positive electrode bus bar 2P on which the upper stage side semiconductor module 11 is disposed. Thus, all (six in the present example) semiconductor modules 5 constituting the inverter 4 are disposed in a matrix of 2 lines by 3 lines on the same plane.

The negative electrode bus bar 2N is disposed along the second lateral direction H2 while the negative electrode bus bar 2N is in contact with the upper surfaces (emitter terminals 5E) of the lower stage side semiconductor modules 12 of all phases. The negative electrode bus bar 2N and the positive electrode bus bar 2P are disposed in parallel with each other along the second lateral direction H2. In the present embodiment, the upper surface of the negative electrode bus bar 2N and the upper surface of the positive electrode bus bar 2P are both positioned on the same plane. When the upper and lower sides are inverted in the vertical direction V, the lower stage side semiconductor modules 12 are disposed on the negative electrode bus bar 2N. Thus, the negative electrode bus bar 2N also functions as the base material B that supports the lower stage side semiconductor modules 12 (semiconductor modules 5).

As described above, the inverter 4 is formed in terms of circuit connection, by disposing the positive electrode bus bar 2P, the output bus bars (51, 52, 53) of respective phases, the negative electrode bus bar 2N, and the semiconductor modules 5. In this state, the terminal connection portions 55 of each semiconductor module 5 are exposed when viewed in the direction along the vertical direction V. As illustrated in FIG. 2, a plurality of the terminal connection portions 55 face the connection terminals 25 from the vertical direction V, and the terminal connection portions 55 are electrically connected to the respective connection terminals 25.

Figure 5:
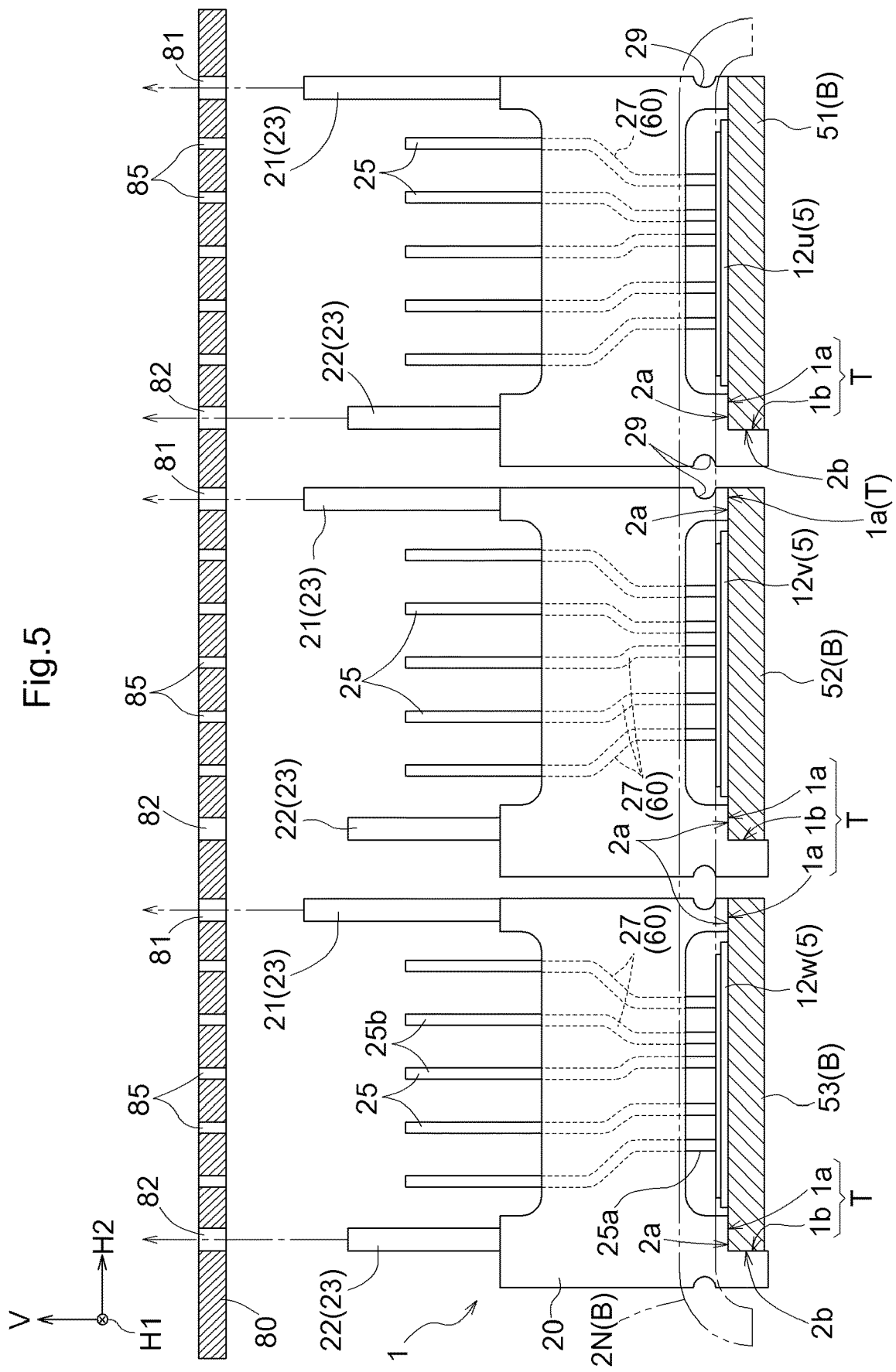
FIG. 5 is a cross-sectional view of the inverter unit and a control board before molding.
Figure 6:
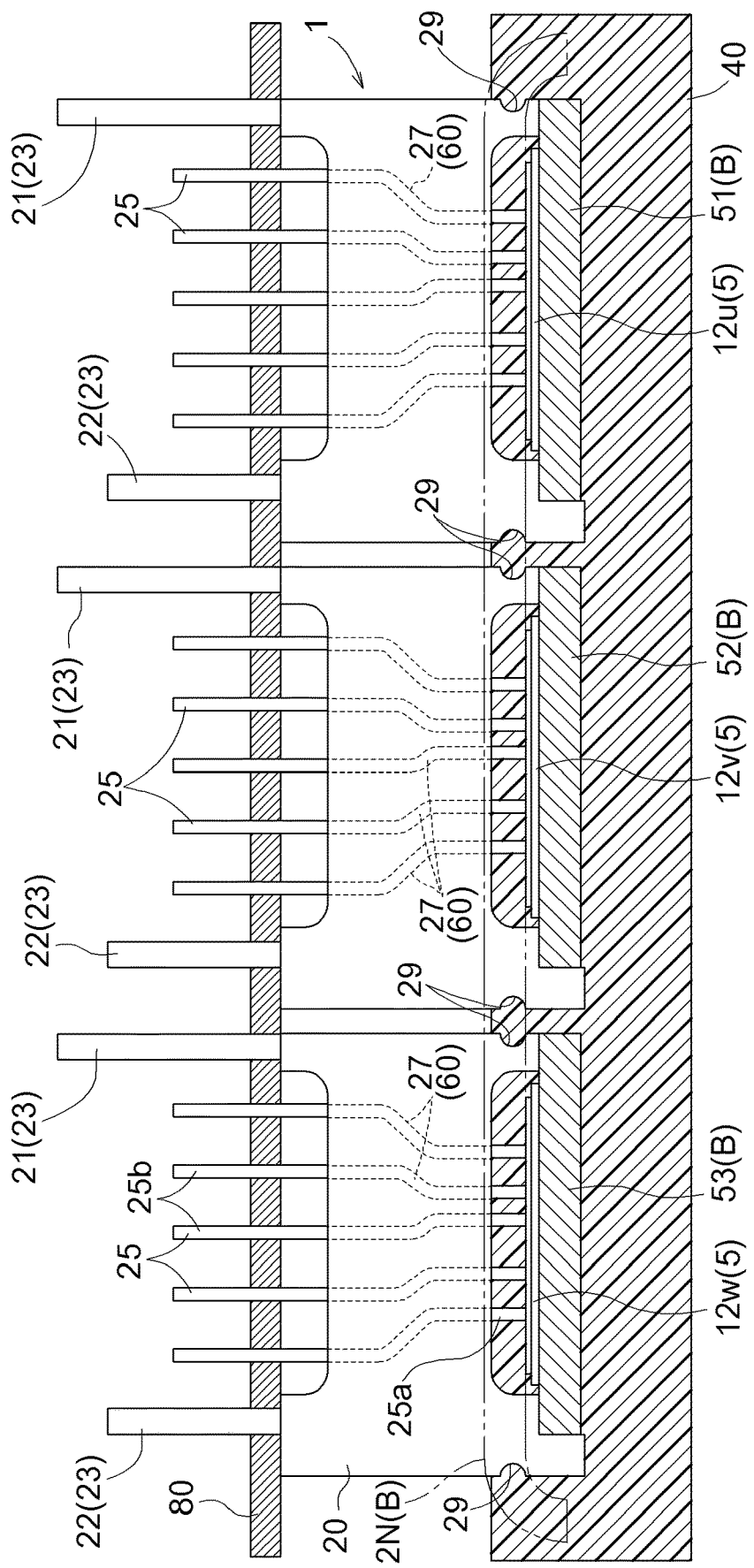
FIG. 6 is a cross-sectional view of the inverter unit and the control board after molding.
Figure 7:
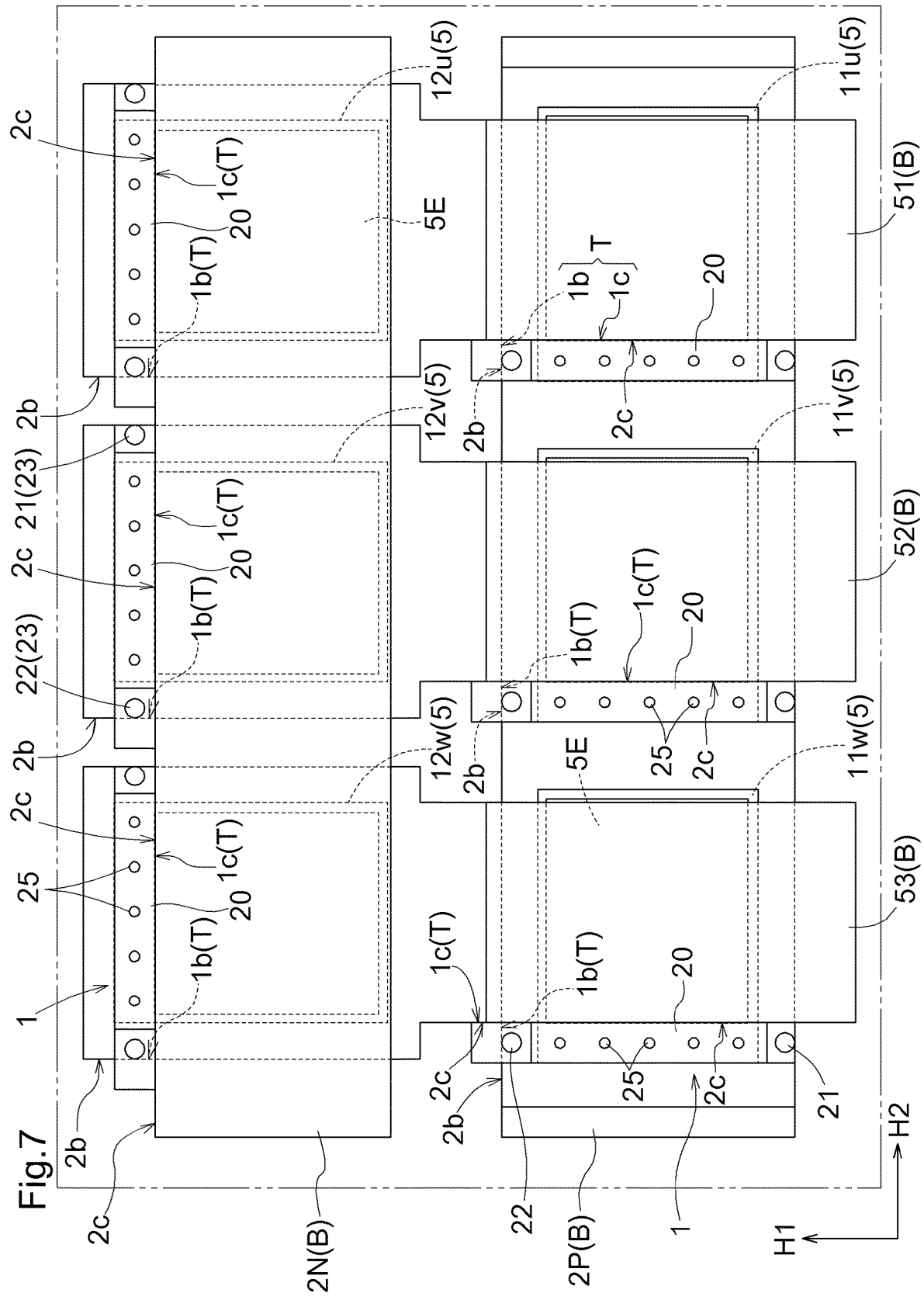
FIG. 7 is a plan view of the inverter unit before molding.

The connection terminals 25 are integrally formed as the connection terminal unit 1 having a terminal mold portion 20 that holds the connection terminals 25. That is, the connection terminal unit 1 has the connection terminals 25 that face the terminal connection portions 55 provided on the semiconductor module 5 including at least one switching element 13 and that are connected to the respective terminal connection portions 55, and the terminal mold portion 20 that holds the connection terminals 25. Hereinafter, description will be provided with reference to a cross-sectional view in FIG. 5 and FIG. 6 and a plan view in FIG. 7. FIG. 5 is the cross-sectional view corresponding to the perspective view in FIG. 3. FIG. 5 illustrates a cross-section in which the control circuit board 80 faces the inverter unit 10 before further resin molding. FIG. 6 is the cross-sectional view corresponding to the perspective view in FIG. 4. FIG. 6 illustrates a cross-section in which the control circuit board 80 is attached to the inverter unit 10 after further resin molding. FIG. 7 is the plan view when viewed in the vertical direction corresponding to the perspective view in FIG. 3.

As illustrated in FIG. 2, and FIG. 5 to FIG. 7, each terminal mold portion 20 has an abutment portion T that abuts against the base materials B supporting the semiconductor module 5. The abutment portion T has vertical abutment portions 1a that abut against the base material B from the vertical direction V that is the direction in which the connection terminals 25 face the terminal connection portions 55, and side abutment portions (1b, 1c) that abut against the base materials B from at least two directions different from each other that intersect in the vertical direction V. The present embodiment illustrates an example of a form in which a first side abutment portion 1b and a second side abutment portion 1c are provided as the side abutment portions. In addition, in the present embodiment, the first side abutment portion 1b and the second side abutment portion 1c are orthogonal to each other and are orthogonal to the vertical direction V. That is, in the present embodiment, the abutment portion T abuts against the base materials B from three directions corresponding to respective axes in a three-dimensional orthogonal coordinate system.

When the terminal connection portions 55 of the upper stage side semiconductor module 11 are connected to the connection terminal unit 1, the connection terminal unit 1 is moved along the vertical direction V so that the connection terminal unit 1 abuts against the positive electrode bus bar 2P and the output bus bar (51, 52, 53) of the corresponding phase, while the terminal connection portions 55 and first end portions 25a of the connection terminals 25 face each other in the vertical direction V, as illustrated in FIG. 2. Specifically, as illustrated in FIG. 2 and FIG. 7, the vertical abutment portions 1a of the connection terminal unit 1 are abutted against a vertical receiving portion 2a corresponding to the upper surface of the positive electrode bus bar 2P, the first side abutment portion 1b is abutted against a first receiving portion 2b corresponding to a side surface of the positive electrode bus bar 2P, and the second side abutment portion 1c is abutted against a second side receiving portion 2c corresponding to a side surface of the output bus bar (51, 52, 53) of the corresponding phase.

When the terminal connection portions 55 of the lower stage side semiconductor module 12 are connected to the connection terminal unit 1, the connection terminal unit 1 is moved along the vertical direction V, so that the connection terminal unit 1 abuts against the output bus bar (51, 52, 53) of the corresponding phase and the negative electrode bus bar 2N, while the terminal connection portions 55 and the first end portions 25a of the connection terminals 25 face each other along the vertical direction V. Specifically, as illustrated in FIG. 2, FIG. 5 and FIG. 7, the vertical abutment portions 1a of the connection terminal unit 1 are abutted against the vertical receiving portion 2a corresponding to the upper surface of the output bus bar (51, 52, 53) of the corresponding phase, the first side abutment portion 1b is abutted against the first receiving portion 2b corresponding to the side surface of the output bus bar (51, 52, 53) of the corresponding phase, and the second side abutment portion 1c is abutted against the second side receiving portion 2c corresponding to the side surface of negative electrode bus bar 2N.

In this way, by positioning the terminal mold portion 20 of the connection terminal unit 1 from three different directions, the terminal connection portions 55 and the connection terminals 25 are also positioned appropriately. As a result, the terminal connection portions 55 and the connection terminals 25 can appropriately face each other and be electrically connected. Specifically, each of the terminal connection portions 55 and the corresponding connection terminal 25 face each other with a slight clearance therebetween, and a conductive joining material such as silver nanopaste or solder is provided in the clearance. The terminal connection portion 55 and the connection terminal 25 are electrically connected by such a conductive joining material.

As illustrated in FIG. 2 to FIG. 7, each terminal mold portion 20 is disposed so that the terminal mold portion 20 at least partially overlaps with the semiconductor module 5 to be connected to the connection terminals 25 held by the terminal mold portion 20, when viewed in the vertical direction along the vertical direction V. More specifically, the terminal mold portion 20 is disposed so as to overlap with the terminal connection portions 55 (target terminal connection portions) to be connected to the connection terminals 25 held by the terminal mold portion 20, when viewed in the vertical direction. The terminal mold portion 20 covers the connection terminals 25 facing the terminal connection portions 55 in the vertical direction V, and holds the connection terminals 25. Thus, the terminal mold portion 20 is disposed so as to overlap with all of the terminal connection portions 55 (target terminal connection portions) when viewed in the vertical direction.

In this way, by connecting the six connection terminal units 1 to the respective semiconductor modules 5, the entire circuit of the inverter 4 including the terminal portions is formed (see FIG. 3). Further, the inverter unit 10 is formed as illustrated in FIG. 4 by integrally molding the positive electrode bus bar 2P, the output bus bars (51, 52, 53) of respective phases, the negative electrode bus bar 2N, the semiconductor modules 5, and the connection terminal units 1 with resin etc.

As described above, FIG. 6 illustrates a cross-sectional view of the inverter unit 10 after the element mold portion 40 is formed. In the terminal mold portion 20 of each connection terminal unit 1, recessed portions 29 recessed in a direction intersecting with the vertical direction V are formed. The element mold portion 40 is formed to include the recessed portions 29 therein. In other words, the terminal mold portion 20 has the recessed portions 29 that are recessed in a direction intersecting with the vertical direction V, at positions corresponding to the inside of the element mold portion 40. When the element mold portion 40 is formed, a molding material such as resin enters the recessed portions 29. Thus, the connection terminal unit 1 can be suppressed from moving in the vertical direction V with respect to the element mold portion 40. That is, the recessed portions 29 function as a retainer that suppresses the connection terminal unit 1 from coming out of the element mold portion 40.

Further, in the present embodiment, as illustrated in FIG. 5 and FIG. 6, the connection terminals 25 each have an in-mold bent portion 27 (movement restriction portion 60) that is bent in the direction intersecting with the vertical direction V in the terminal mold portion 20. This makes it difficult for the connection terminal 25 to come off the terminal mold portion 20. As described above, the terminal mold portion 20 does not easily come off the element mold portion 40 and the connection terminal 25 does not easily come off the terminal mold portion 20 and thus, the reliability of the connection terminal unit 1 is improved.

The control circuit board 80 on which the inverter control device 8 and the drive circuit 7 are formed is connected to the inverter unit 10 in which the element mold portion 40 is formed, as illustrated in FIG. 5 and FIG. 6. Specifically, in each of the connection terminals 25, an end portion (second end portion 25b) on the opposite side of the connection terminal 25 from an end portion (first end portion 25a) on the side connected to the terminal connection portion 55 is connected to the control circuit board 80 by extending through a corresponding one of terminal connection holes 85 formed in the control circuit board 80 of the semiconductor module 5. However, aligning the positions so that the connection terminals 25 extend through the terminal connection holes 85 is not easy. Thus, positioning portions 23, which are engaged to the control circuit board 80, for positioning the control circuit board 80 in the direction along the circuit board surface are formed in the terminal mold portion 20.

In the present embodiment, each positioning portion 23 is formed in a column shape protruding further toward the control circuit board 80 side than the connection terminals 25 do, along the vertical direction V. The columnar positioning portion 23 is engaged with a hole portion (first engagement hole 81, second engagement hole 82) formed in the control circuit board 80. The present embodiment illustrates an example of a form in which the first engagement hole 81 and the second engagement hole 82 are through holes that extend through the control circuit board 80, and the columnar positioning portions 23 extend through the control circuit board 80. The present embodiment also illustrates an example of a form in which one connection terminal unit 1 has two columnar portions (first columnar positioning portion 21, second columnar positioning portion 22) as the positioning portions 23. The two columnar portions have different protruding lengths toward the control circuit board 80, and the first columnar positioning portion 21 has a longer protruding length than the second columnar positioning portion 22. In this way, it is possible to engage only one columnar portion (first columnar positioning portion 21) with the first engagement hole 81, and easily perform temporary positioning. Since positioning at one location is completed, the other columnar portion (second columnar positioning portion 22) can also be easily engaged with the second engagement hole 82 thereafter to complete positioning.

Figure 8:
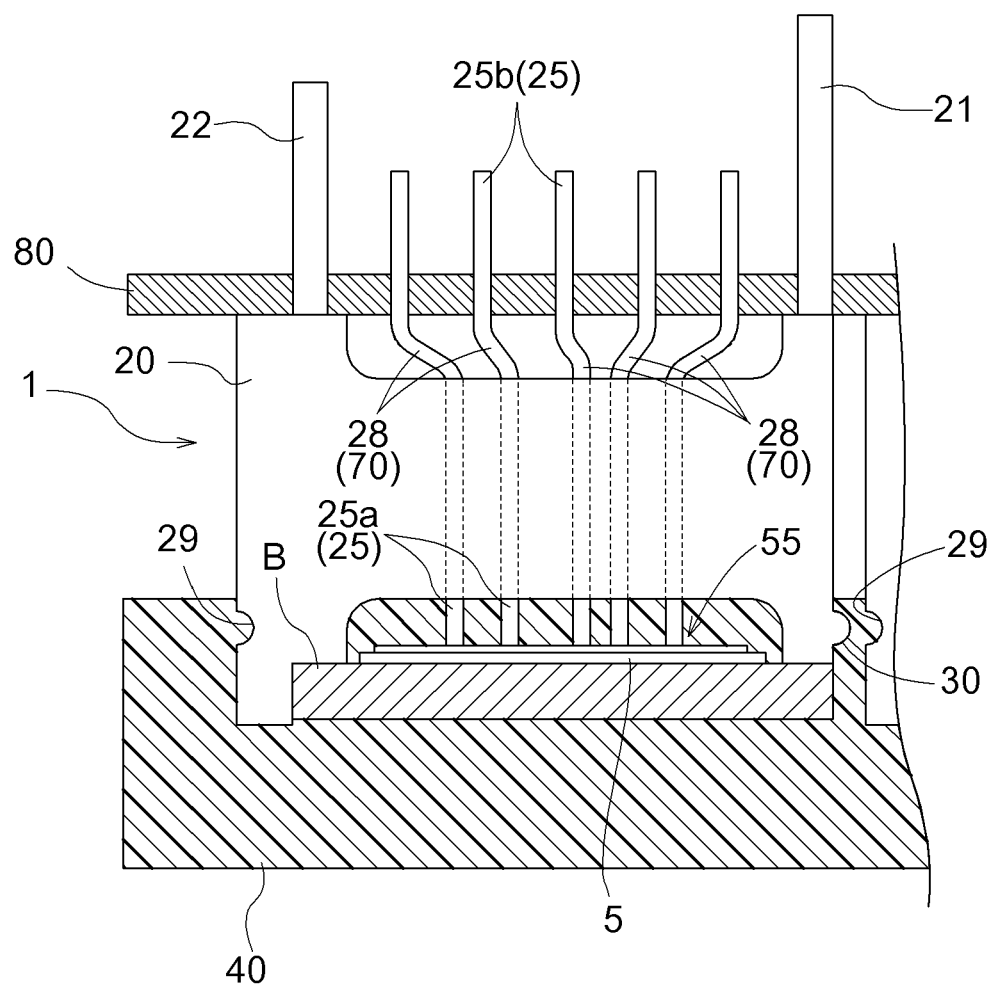
FIG. 8 is an enlarged cross-sectional view of another configuration example of the inverter unit and the control board after molding.

There is a case in which the control circuit board 80 is a plate-shaped member and warps and deflections are generated. When warps and deflections are generated in the control circuit board 80, there is a possibility that intervals between the terminal connection holes 85 in the direction orthogonal to the vertical direction V change, and that stress is applied to the connection terminals 25, which are extended through the terminal connection holes 85 and fixed by solder or the like. In order to absorb the stress, for example, as illustrated in FIG. 8, it is preferable that the connection terminals 25 (low-rigidity portions 70) each have an out-of-mold bent portion 28 bent in a direction intersecting the vertical direction V outside the terminal mold portion 20 (outside the terminal mold portion 20 and on the control circuit board 80 side). That is, it is preferable that the out-of-mold bent portions 28 serving as the low-rigidity portions 70 be provided between the terminal mold portion 20 and the end portions (second end portions 25b) on the opposite side of the connection terminals 25 from the end portions (first end portions 25a) on the side connected to the terminal connection portions 55.

Figure 9:
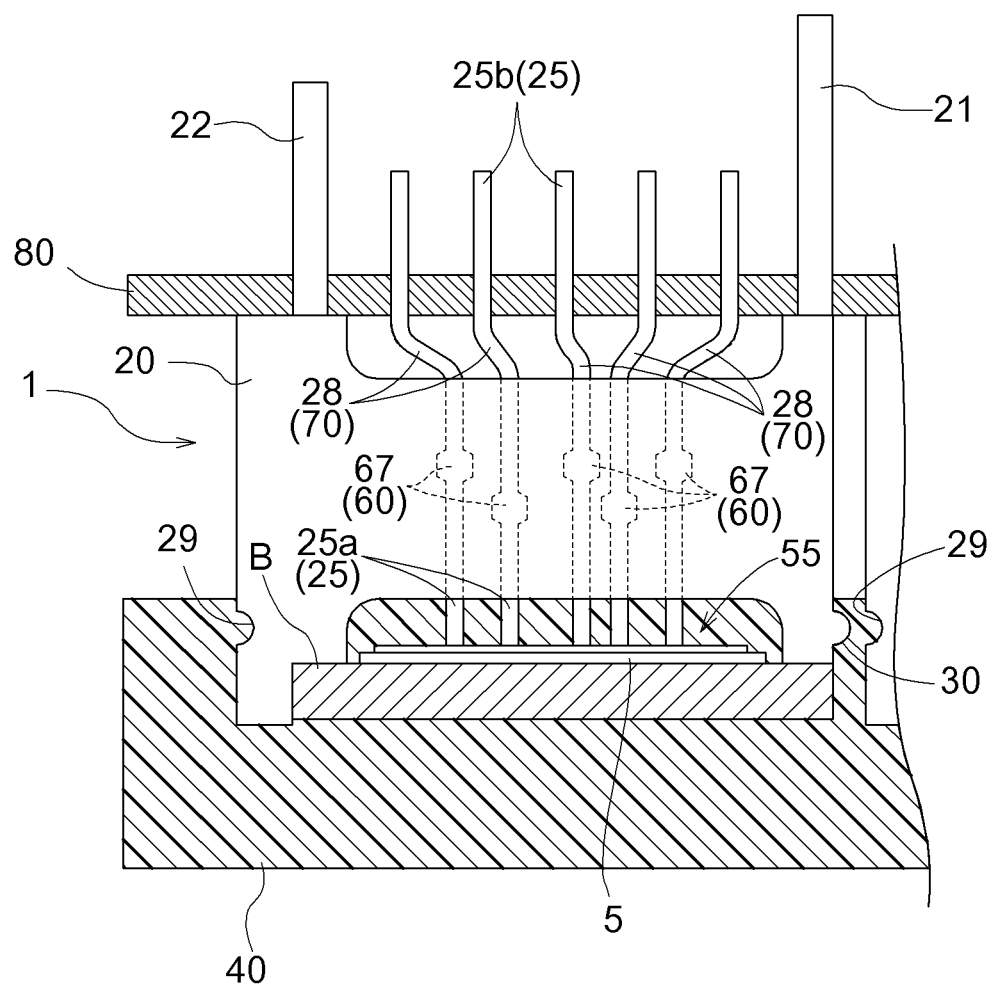
FIG. 9 is an enlarged cross-sectional view of another configuration example of the inverter unit and the control board after molding.

FIG. 8 illustrates an example of a form having the out-of-mold bent portions 28 without having the movement restriction portions 60 such as the in-mold bent portions 27 described above with reference to FIG. 5 and FIG. 6. However, as a matter of course, the form may have the movement restriction portions 60, which restrict movement of the connection terminals 25 in the vertical direction V, in the terminal mold portion 20, and may have the low-rigidity portions 70 such as the out-of-mold bent portions 28, outside the terminal mold portion 20. The movement restriction portions 60 are not limited to the form such as the in-mold bending portions 27 described above with reference to FIG. 5 and FIG. 6, and may be swelled portions 67 as illustrated in FIG. 9.

The above description illustrates an example of a form in which the recessed portions 29 recessed in the direction intersecting the vertical direction V are formed in the terminal mold portion 20 at positions corresponding to the inside of the element mold portion 40. However, in order to make it difficult for the terminal mold portion 20 to come off the element mold portion 40, not only the recessed portion 29 but also a protruded portion 30 protruding in the direction intersecting with the vertical direction V may be formed, as illustrated in FIG. 8. FIG. 8 illustrates an example of a form in which the recessed portion 29 and the protruded portion 30 are formed. However, only the protruded portions 30 may be formed without the recessed portion 29 being provided (not shown).

The forms described above with reference to FIG. 8 and FIG. 9 illustrate an example of a form in which the low-rigidity portions 70 are provided between the terminal mold portion 20 and the end portions (second end portions 25*b*) on the opposite side of the connection terminals 25 from the end portions (first end portions 25*a*) on the side connected to the terminal connection portions 55. However, the low-rigidity portions 70 may be provided between the terminal mold portion 20 and the end portions (first end portions 25*a*) of the connection terminals 25 on the side connected to the terminal connection portions 55 (see FIG. 10). When the low-rigidity portions 70 are provided between the second end portions 25*b* and the terminal mold portion 20, as described above, the effect of absorbing the stress caused when the control circuit board 80 is warped or bent is acquired. When the low-rigidity portions 70 are provided between the first end portions 25*a* and the terminal mold portion 20, an effect is acquired in which errors caused by warping of the semiconductor module 5 and by variation in the thickness of the conductive joining material that joins the connection terminals 25 and the terminal connection portions 55 are absorbed and the connectivity of the first end portions 25*a* and terminal mold portion 20 is improved.

Figure 10:
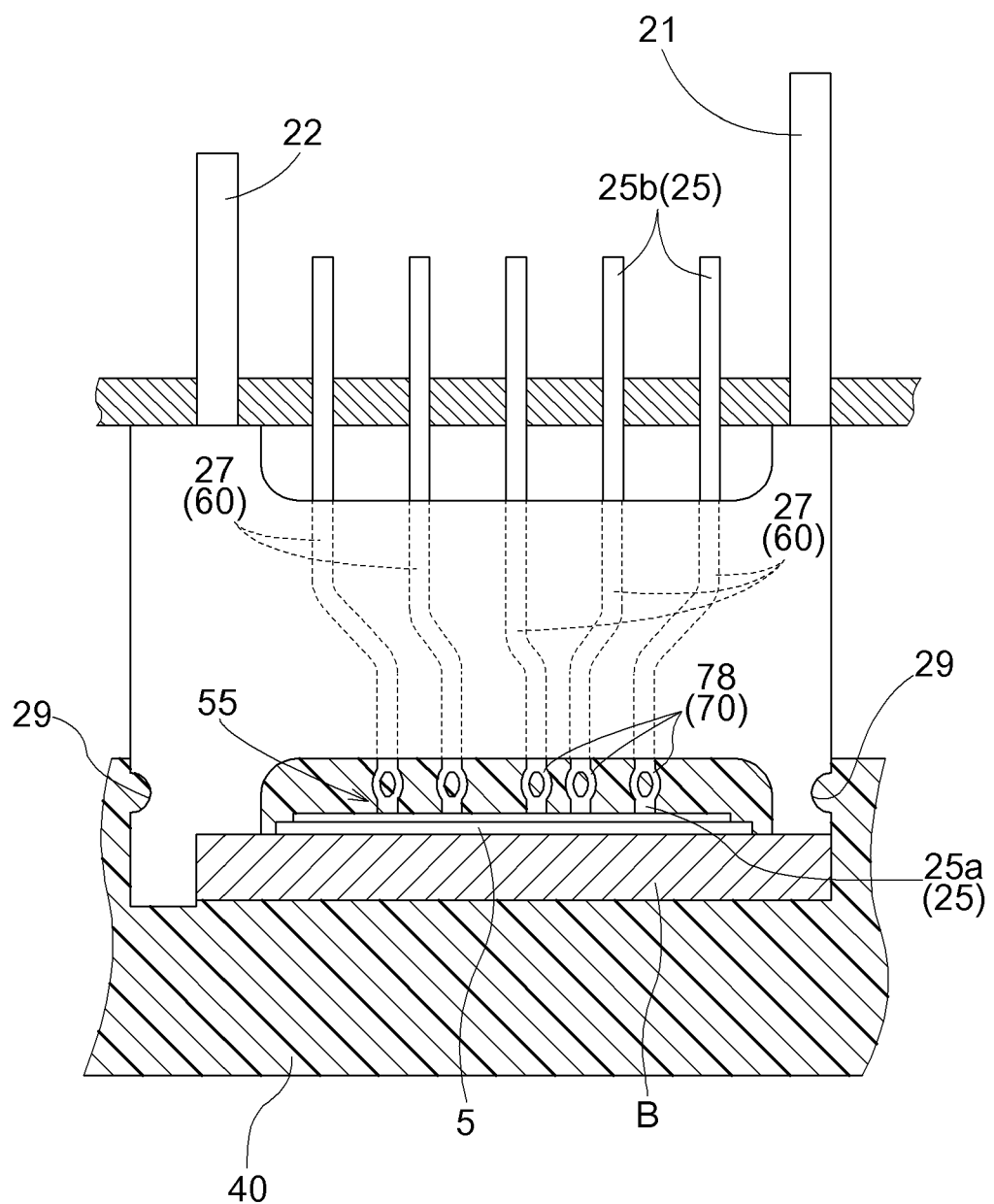
FIG. 10 is an enlarged cross-sectional view of another configuration example of the inverter unit and the control board after molding.

FIG. 10 illustrates an example of a form in which the low-rigidity portions 70 provided between the first end portions 25*a* and the terminal mold portion 20 are configured as annular spring portions 78. Each of the annular spring portions 78 is a spring-like portion that bends at least in the vertical direction V, and easily absorbs errors when joining the connection terminal 25 and the terminal connection portion 55 as described above. As described above, the semiconductor module 5 and the terminal mold portion 20 are integrally molded by the element mold portion 40. As illustrated in FIG. 10, the low-rigidity portions 70 are provided at positions corresponding to the inside of the element mold portion 40. It is possible to absorb errors by utilizing the elastic force of the low rigidity portions 70 when the connection terminal unit 1 is installed on the semiconductor module 5, and it is possible to eliminate the elastic force of the low rigidity portions 70 after the installation as the low rigidity portions 70 are subjected to resin molding. In this way, it is possible to reduce the influence of vibration and the like under a using environment. For example, since the possibility that resonance occurs in the low-rigidity portions 70 due to vibration is reduced, the lifetime of the inverter unit 10 can be expected to be prolonged.

Figure 11:
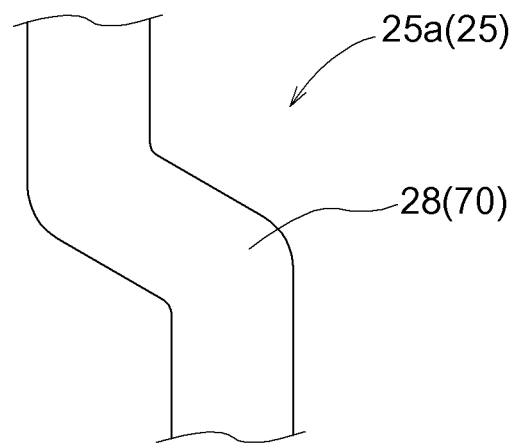
FIG. 11 is an enlarged view of another example of a low-rigidity portion (out-of-mold bending portion) on a first end portion side.
Figure 12:
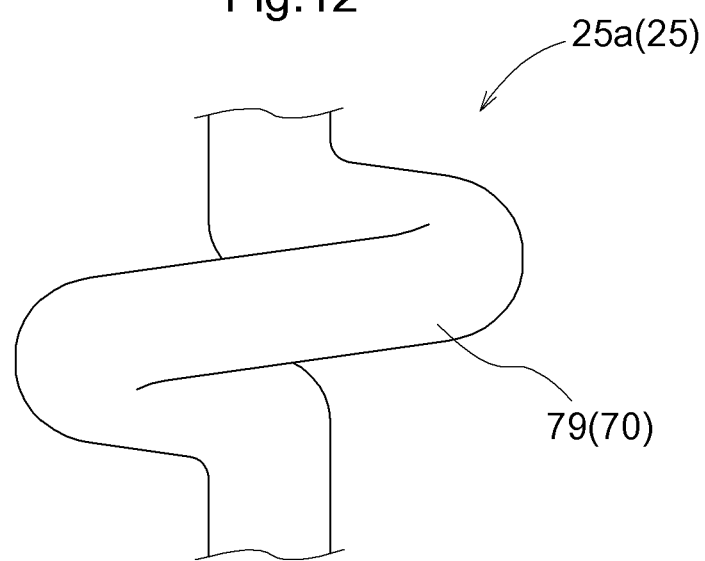
FIG. 12 is an enlarged view of the other example (coil spring portion) of the low-rigidity portion on the first end portion side.

FIG. 10 illustrates an example in which the spring-like portions (annular spring portions 78) are set as the low-rigidity portions 70 provided between the first end portions 25*a* and the terminal mold portion 20. However, as illustrated in FIG. 11, the low-rigidity portions 70 may be the out-of-mold bent portions 28 bent in the direction intersecting the vertical direction V, similar to the low-rigidity portions 70 provided between the second end portions 25*b* and the terminal mold portion 20. Although not shown, similarly, the low-rigidity portions 70 provided between the second end portions 25*b* and the terminal mold portion 20 may be the spring-like portions (annular spring portions 78). Further, although FIG. 10 illustrates the annular spring portions 78 as the spring-like portions, the spring-like portions may each have another structure as long as the structure is a spring-like shape having elasticity. For example, as illustrated in FIG. 12, the spring-like portion may be a coil spring portion 79.

As described above, by using the connection terminal unit 1 according to the present embodiment, it is possible to appropriately connect the connection terminal unit 1 and the terminal connection portions 55 of the semiconductor module 5 including the switching element 13, and it is possible to further reduce the projected area when viewed in the direction orthogonal to the direction along the chip surface.

Other Embodiments

Hereinafter, other embodiments will be described. The configuration of each embodiment described below may not only be used by itself, but also be combined with any of the configurations of the other embodiments unless inconsistency arises.

(1) The connection terminal unit 1 connected to the terminal connection portion 55 of the semiconductor module 5 configuring the inverter 4 is described above as an example. However, the semiconductor module 5 to which the connection terminal unit 1 is connected does not have to configure the inverter 4. As a matter of course, as described above, the preferred embodiment is not limited to the form in which six connection terminal units 1 are connected to six semiconductor modules 5, and one connection terminal unit 1 may be connected to one semiconductor module 5. Further, a configuration may be such that a plurality of connection terminal units 1 are connected to one semiconductor module 5.

(2) Described above is an example of a form that has the first side abutment portion 1*b* and the second side abutment portion 1*c* as the side abutment portions that abut against the base material B from at least two direction different from each other that intersect with the vertical direction V. Then, an example of a form is illustrated in which the first side abutment portion 1*b* and the second side abutment portion 1*c* abut against the base materials B from the directions that are orthogonal to each other and that are orthogonal to the vertical direction V. However, the first side abutment portion 1*b* and the second side abutment portion 1*c* may abut against the base materials B from directions that are not orthogonal to each other as long as they are intersecting directions. The first side abutment portion 1*b* and the second side abutment portion 1*c* may abut against the base materials B from directions that are not orthogonal to the vertical direction V as long as they are directions intersecting with the vertical direction V. Further, the number of the side abutment portions may be one. For example, a side abutment portion can be configured by using a knock pin etc. that abuts against two different surfaces at the same time. When the side abutment portion is configured by a knock pin etc., there is a possibility that the direction of abutment is not uniquely determined. However, the side abutment portion may abut against the base materials B from at least two directions by intersecting with the vertical direction V.

(3) The above description illustrates an example of a form in which each semiconductor module 5 is provided with five terminal connection portions 55, and each connection terminal unit is provided with five connection terminals 25. Since the number of terminal connection portions 55 differs depending on the configuration of the semiconductor module 5, the number of terminal connection portions 55 may be less than five, or may be six or more. In some cases, it is not necessary to connect all of the terminal connection portions 55 of the semiconductor module 5 to another circuit such as the control circuit board 80. Thus, the number of terminal connection portions 55 and the number of connection terminals 25 may be different.

(4) The above description illustrates an example of a form in which two positioning portions 23 are formed in one connection terminal unit 1. However, one positioning terminal 23 may be formed in one connection terminal unit 1.

(5) The above description illustrates an example of a form in which the positioning portions 23 are formed in all six connection terminal units 1. However, the positioning portions 23 may be formed on only some of the connection terminal units 1. Even when the number of the positioning portions 23 formed on one connection terminal unit 1 is one, workability when the connection terminals 25 are extended through the terminal connection holes 85 of the control circuit board 80 is improved, by determining the relative position of at least one connection terminal unit 1 and the control circuit board 80.

Summary of Embodiment

Hereinafter, an overview of the connection terminal unit 1 described above will be described briefly.

As one aspect, a connection terminal unit (1) includes: a plurality of connection terminals (25) that face a plurality of terminal connection portions (55) provided in a semiconductor module (5) including at least one switching element (13) and that are connected to the respective terminal connection portions (55); and a terminal mold portion (20) holding the connection terminals (25). The terminal mold portion (20) has an abutment portion (T) that abuts against the semiconductor module (5) or a base material (B) holding the semiconductor module (5). The abutment portion (T) has a vertical abutment portion (1a) that abuts against the semiconductor module or the base material from a vertical direction (V) that is a direction in which the connection terminals (25) face the terminal connection portions (55), and a side abutment portion (1b, 1c) that abuts against the semiconductor module or the base material from at least two directions that are different from each other and intersect with the vertical direction (V).

With this configuration, since the connection terminals (25) face the respective terminal connection portions (55) so that the connection terminals (25) and the terminal connection portions (55) are connected, no space is required for wiring a bonding wire and the like. Here, it is preferable that the relative positions of the connection terminal unit (1) and the semiconductor module (5) be accurately aligned so that each connection terminal (25) and each terminal connection portion (55) face each other appropriately. According to the present configuration, the relative positions in the vertical direction (V) are regulated by the vertical abutment portion (1a), and the relative positions in two directions intersecting with the vertical direction (V) are defined by the side abutment portion (1b, 1c). That is, since the relative positions of the connection terminal unit (1) and the semiconductor module (5) are defined from three directions, the positions of each connection terminal (25) and each terminal connection portion (55) can be accurately aligned so as to face each other appropriately. In other words, with the connection terminal unit (1) according to the present configuration, the connection terminal unit (1) can be appropriately connected to the terminal connection portions (55) of the semiconductor module (5) including the semiconductor element (13), and the projected area when seen in a direction orthogonal to the direction along the chip surface can be further decreased.

Here, it is preferable that the terminal mold portion (20) be disposed such that the terminal mold portion (20) at least partially overlaps with the semiconductor module (5) to be connected to the connection terminals (25) held by the terminal mold portion (20), when seen in a vertical direction along the vertical direction (V).

According to this configuration, since the terminal mold portion (20) overlaps with the semiconductor module (5) when seen in the vertical direction (V), the projected area when seen in a direction orthogonal to the direction along the chip surface of the semiconductor module (5) can be reduced.

Here, it is preferable that the connection terminal (25) have a movement restriction portion (60) that restricts movement of the connection terminal (25) in the vertical direction (V) inside the terminal mold portion (20).

By having the movement restriction portion (60) inside the terminal mold portion (20), the connection terminal (25) is less likely to come off the terminal mold portion (20). As a result, reliability of the connection terminal unit (1) is improved.

Here, it is preferable that the movement restriction portion (60) be an in-mold bent portion (27) that is bent in a direction intersecting with the vertical direction (V), inside the terminal mold portion (20).

By having the in-mold bent portion (27) inside the terminal mold portion (20), the connection terminal (25) is less likely to come off the terminal mold portion (20). Thus, the in-mold bending portion (27) is a preferred form of the movement restriction portion (60).

It is preferable that the connection terminal (25) have a low-rigidity portion (70) outside the terminal mold portion (20), the low-rigidity portion (70) having a rigidity lower than that of another portion of the connection terminal (25).

An end portion (25b) of the connection terminal (25) on one side is connected to the terminal connection portion (55) of the semiconductor module (5) and an end portion (25b) thereof on the other side is connected to another member. There is a case in which the other member to which the end portion (25b) on the other side is connected is a member such as a circuit board that is changed or varied in shape due to the effects of warping and deformation. There is a case in which the semiconductor module (5) is also warped and deformed, or a case in which the coating thickness of the conductive joining material is widely varied (a case in which the state of the connection destination is varied). If the connection terminal (25) has a low-rigidity portion (70) outside the terminal mold portion (20), even when the shape or the state of these members to be connected to the connection terminal (25) is varied or changed, it is possible to absorb the variation or change in the shape or the state with the low-rigidity portion (70). As a result, it is possible to reduce the effect of the external force, which is generated due to the shape and the state of the member to be connected, applied to the terminal mold portion (20) and the terminal connection portion (55) of the semiconductor module (5).

It is preferable that the low-rigidity portion (70) be an out-of-mold bent portion (28) that is bent in a direction intersecting with the vertical direction (V), or a spring-like portion (78, 79) that is deflected at least in the vertical direction (V).

The out-of-mold bent portion (28) has a shape capable of absorbing the change or the variation in the shape even when the shape of the member to be connected is varied or changed. Thus, the out-of-mold bent portion (28) is preferable as a structure of the low-rigidity portion (70). Further, the spring-like portion (78, 79) also has a shape capable of absorbing the change or the variation in the shape by the elastic force, even when the shape of the member to be connected is varied or changed. Therefore, the spring portion (78, 79) is also preferable as the structure of the low-rigidity portion (70).

Here, it is preferable that the low-rigidity portion (70) be provided between the terminal mold portion (20) and an end portion (25*b*) on an opposite side of each of the connection terminals (25) from an end portion (25*a*) on a side connected to the terminal connection portion (55).

As described above, there is a case in which the end portion (25*b*) on the opposite side of the connection terminal (25) from the end portion (25*a*) on the side connected to the terminal connection portion (55) is connected to a member such as a circuit board that is changed or varied in shape due to warping or deflection. When the low-rigidity portion (70) is provided at the position described above, even if there is a change or variation in the shape of the circuit board etc., the change or the variation can be absorbed by the low-rigidity portion (70).

Alternatively, it is preferable that the low-rigidity portion (70) be provided between the terminal mold portion (20) and an end portion (25*a*) of each of the connection terminals (25) on a side connected to the terminal connection portion (55).

When the low-rigidity portion (70) is provided at this position, even when the semiconductor module (5) is warped or when the coating thickness of the conductive joining material is widely varied, such a change or a variation can be absorbed by the low-rigidity portion (70). Thus, the connectivity of the connection terminal (25) to the semiconductor module (5) is improved, and reliability is improved.

It is preferable that the semiconductor module (5) and the terminal mold portion (20) be integrally molded by an element mold portion (40), and when the low-rigidity portion (70) is provided between the terminal mold portion (20) and the end portion (25*a*) of each of the connection terminals (25) on the side connected to the terminal connection portion (55), it is preferable that the low-rigidity portion (70) be provided at a position corresponding to an inside of the element mold portion (40).

According to this configuration, when the connection terminal (25) is connected to the semiconductor module (5), it is possible to appropriately absorb the change or the variation in the shape or the state on the semiconductor module (5) side by using the elastic force of the low-rigidity portion (70). After the connection terminal (25) is connected to the semiconductor module (5), the low-rigidity portion (70) is molded inside the element mold portion (40), and the elastic force of the low-rigidity portion (70) is lost. Thus, the stress applied to the connection position (terminal connection portion (55)) between the semiconductor module (5) and the connection terminal (25) due to vibration etc. in the using environment is also reduced. Therefore, a longer life of the device including the semiconductor module (5) and the connection terminal (25) can be expected.

It is preferable that the semiconductor module (5) and the terminal mold portion (20) be integrally molded by an element mold portion (40), and the terminal mold portion (20) have a recessed portion (29) that is recessed in a direction intersecting with the vertical direction (V) or a protruded portion (30) that is protruded in the direction intersecting with the vertical direction (V), at a position corresponding to an inside of the element mold portion (40).

Since the terminal mold portion (20) has such a recessed portion (29) or a protruded portion (30), the possibility that the connection terminal unit (1) comes off the element mold portion (40) in the vertical direction (V) can be reduced.

It is preferable that an end portion (25*b*) on an opposite side of each of the connection terminals (25) from a side connected to the terminal connection portion (55) be configured so as to be connected to a control circuit board (80) by extending through a corresponding one of a plurality of terminal connection holes (85) formed in the control circuit board (80) in which a control circuit (8) for the semiconductor module (5) is formed, and the terminal mold portion (20) have a positioning portion (23) that is engaged to the control circuit board (80) and that positions the control circuit board (80) in a direction along a circuit board surface.

In order to make the connection terminals (25) appropriately extend through the terminal connection holes (85) formed in the control circuit board (80), it is preferable that the relative positions of the control circuit board (80) and the connection terminal unit (1) be accurately aligned. With the present configuration, since the positioning portion (23) formed in the terminal mold portion (20) is engaged with the control circuit board (80), it is possible to accurately align the circuit board (80) and the connection terminal unit (1). As a result, the connection terminals (25) can be easily and appropriately extended through the terminal connection holes (85).

As described above, it is preferable that the positioning portion (23) be formed in a column shape protruded further toward a control circuit board (80) side than the connection terminals (25) do along the vertical direction (V), and be engaged to a hole portion (81, 82) formed in the control circuit board (80), when the terminal mold portion (20) has a positioning portion (23) that is engaged to the control circuit board (80) and that positions the control circuit board (80) in a direction along a circuit board surface.

According to this configuration, since the columnar positioning portion (23) protruded further toward the control circuit board (80) side is engaged to the control circuit board (80) before the connection terminals (25) do, the control circuit board (80) and the connection terminal unit (1) are appropriately aligned when the connection terminals (25) are extended through the terminal connection holes (85) of the control circuit board (80). Thus, the connection terminals (25) can be easily and appropriately extended through the terminal connection holes (85) formed in the control circuit board (80).

When the positioning portion (23) is formed in a columnar shape, it is preferable that the positioning portion (23) have two columnar portions (21, 22) having different protruding lengths toward the control circuit board (80) side.

When the two columnar positioning portions (23) are engaged with the control circuit board at the same time, accuracy is required for aligning the control circuit board (80) and the connection terminal unit (1). However, when the configuration has two columnar portions that have different protruding lengths toward the control circuit board (80) side, it is possible to engage one columnar portion (21) having a long protruding length with the control circuit board (80) first. Thus, compared to when the two columnar positioning portions (23) are engaged with the control circuit board (80) at the same time, alignment of the control circuit board (80) and the connection terminal unit (1) becomes easy. Since the other columnar positioning portion (22) need only be engaged with the control circuit board (80) while one columnar positioning portion (21) is engaged with the control circuit board (80), the alignment in this case also becomes easy.

Thus, according to the present configuration, it is possible to easily and accurately align the control circuit board (80) and the connection terminal unit (1), and make the connection terminals (25) easily and appropriately extend through the terminal connection holes (85) formed in the control circuit board (80).

DESCRIPTION OF THE REFERENCE
NUMERALS

1: Connection terminal unit
1a: Vertical abutment portion
1b: First side abutment portion (side abutment portion)
1c: Second side abutment portion (side abutment portion)
2N: Negative electrode bus bar (base material)
2P: Positive electrode bus bar (base material)
5: Semiconductor module
7: Drive circuit
8: Inverter control device (semiconductor module control circuit)
11: Upper stage side semiconductor module (semiconductor module)
12: Lower stage side semiconductor module (semiconductor module)
13: Switching element
20: Terminal mold portion
21: First columnar positioning portion (two columnar portions with different protruding lengths)
22: Second columnar positioning portion (two columnar portions with different protruding lengths)
23: Positioning portion
25: Connecting terminal
25a: First end portion (end portion connected to terminal connection portion)
25b: Second end portion (end portion on opposite side of connection terminal from side connected to terminal connection portion)
27: In-mold bent portion (movement restriction portion)
28: Out-of-mold bent portion (low-rigidity portion)
29: Recessed portion
30: Protruded portion
40: Element mold portion
51: First output bus bar (base material)
52: Second output bus bar (base material)
53: Third output bus bar (base material)
55: Terminal connection portion
60: Movement restriction portion
67: Swelled portion (movement restriction portion)
70: Low-rigidity portion
78: Annular spring portion (spring-like portion)
79: Coil spring portion (spring-like portion)
80: Control board
81: First engagement hole (hole portion formed in control board)
82: Second engagement hole (hole portion formed in control board)
85: Terminal connection hole
B: Base material
H1: First lateral direction (direction intersecting vertical direction)
H2: Second lateral direction (direction intersecting vertical direction)
T: Abutment portion

The invention claimed is:

1. A connecting terminal unit comprising:
a plurality of connection terminals that face a plurality of terminal connection portions provided in a semiconductor module including at least one switching element and that are connected to the respective terminal connection portions; and
a terminal mold portion holding the connection terminals such that the connection terminals extend through the terminal mold portion and extend outside and vertically beyond both an upper surface and a lower surface of the terminal mold portion, wherein
the terminal mold portion has an abutment portion that abuts against the semiconductor module or a base material holding the semiconductor module, and
the abutment portion has a vertical abutment portion that abuts against the semiconductor module or the base material from a vertical direction that is a direction in which the connection terminals face the terminal connection portions, and a side abutment portion that abuts against the semiconductor module or the base material from at least two directions that are different from each other and intersect with the vertical direction.

2. The connection terminal unit according to claim 1, wherein the connection terminal has a movement restriction portion that restricts movement of the connection terminal in the vertical direction inside the terminal mold portion.

3. The connection terminal unit according to claim 1, wherein the connection terminal has a low-rigidity portion outside the terminal mold portion, the low-rigidity portion having a rigidity lower than that of another portion of the connection terminal.

4. The connection terminal unit according to claim 1, wherein
the semiconductor module and the terminal mold portion are integrally molded by an element mold portion, and
the terminal mold portion has a recessed portion that is recessed in a direction intersecting with the vertical direction or a protruded portion that is protruded in the direction intersecting with the vertical direction, at a position corresponding to an inside of the element mold portion.

5. The connection terminal unit according to claim 1, wherein
an end portion on an opposite side of each of the connection terminals from a side connected to the terminal connection portion is configured so as to be connected to a control circuit board by extending through a corresponding one of a plurality of terminal connection holes formed in the control circuit board in which a control circuit for the semiconductor module is formed, and
the terminal mold portion has a positioning portion that is engaged to the control circuit board and that positions the control circuit board in a direction along a circuit board surface.

6. The connection terminal unit according to claim 1, wherein the terminal mold portion is disposed such that the terminal mold portion at least partially overlaps with the semiconductor module to be connected to the connection terminals held by the terminal mold portion, when seen in a vertical direction along the vertical direction.

7. The connection terminal unit according to claim 6, wherein the connection terminal has a low-rigidity portion outside the terminal mold portion, the low-rigidity portion having a rigidity lower than that of another portion of the connection terminal.

8. The connection terminal unit according to claim 6, wherein
the semiconductor module and the terminal mold portion are integrally molded by an element mold portion, and
the terminal mold portion has a recessed portion that is recessed in a direction intersecting with the vertical direction or a protruded portion that is protruded in the direction intersecting with the vertical direction, at a position corresponding to an inside of the element mold portion.

9. The connection terminal unit according to claim 6, wherein
an end portion on an opposite side of each of the connection terminals from a side connected to the terminal connection portion is configured so as to be connected to a control circuit board by extending through a corresponding one of a plurality of terminal connection holes formed in the control circuit board in which a control circuit for the semiconductor module is formed, and
the terminal mold portion has a positioning portion that is engaged to the control circuit board and that positions the control circuit board in a direction along a circuit board surface.

10. The connection terminal unit according to claim 6, wherein the connection terminal has a movement restriction portion that restricts movement of the connection terminal in the vertical direction inside the terminal mold portion.

11. The connection terminal unit according to claim 10, wherein the movement restriction portion is an in-mold bent portion that is bent in a direction intersecting with the vertical direction.

12. The connection terminal unit according claim 11, wherein the connection terminal has a low-rigidity portion outside the terminal mold portion, the low-rigidity portion having a rigidity lower than that of another portion of the connection terminal.

13. The connection terminal unit according to claim 12, wherein the low-rigidity portion is an out-of-mold bent portion that is bent in a direction intersecting with the vertical direction, or a spring-like portion that is deflected at least in the vertical direction.

14. The connection terminal unit according to claim 13, wherein the low-rigidity portion is provided between the terminal mold portion and an end portion of each of the connection terminals on a side connected to the terminal connection portion.

15. The connection terminal unit according to claim 14, wherein
the semiconductor module and the terminal mold portion are integrally molded by an element mold portion, and
the low-rigidity portion is provided at a position corresponding to an inside of the element mold portion.

16. The connection terminal unit according to claim 13, wherein the low-rigidity portion is provided between the terminal mold portion and an end portion on an opposite side of each of the connection terminals from an end portion on a side connected to the terminal connection portion.

17. The connection terminal unit according to claim 16, wherein
the semiconductor module and the terminal mold portion are integrally molded by an element mold portion, and
the terminal mold portion has a recessed portion that is recessed in a direction intersecting with the vertical direction or a protruded portion that is protruded in the direction intersecting with the vertical direction, at a position corresponding to an inside of the element mold portion.

18. The connection terminal unit according to claim 17, wherein
an end portion on an opposite side of each of the connection terminals from a side connected to the terminal connection portion is configured so as to be connected to a control circuit board by extending through a corresponding one of a plurality of terminal connection holes formed in the control circuit board in which a control circuit for the semiconductor module is formed, and
the terminal mold portion has a positioning portion that is engaged to the control circuit board and that positions the control circuit board in a direction along a circuit board surface.

19. The connection terminal unit according to claim 18, wherein the positioning portion is formed in a column shape protruded further toward a control circuit board side than the connection terminals do along the vertical direction, and is engaged to a hole portion formed in the control circuit board.

20. The connection terminal unit according to claim 19, wherein the positioning portion has two columnar portions having different protruding lengths toward the control circuit board side.

\* \* \* \* \*